(12) United States Patent
Smith et al.

(10) Patent No.: US 7,612,892 B2
(45) Date of Patent: Nov. 3, 2009

(54) IMAGING OPTICAL SYSTEM CONFIGURED WITH THROUGH THE LENS OPTICS FOR PRODUCING CONTROL INFORMATION

(75) Inventors: Daniel G. Smith, Oro Valley, AZ (US); David M. Williamson, Tucson, AZ (US); W. Thomas Novak, Hillsborough, CA (US)

(73) Assignee: Nikon Corporation (JP)

( * ) Notice: Subject to any disclaimer, the term of this patent is extended or adjusted under 35 U.S.C. 154(b) by 100 days.

(21) Appl. No.: 11/544,833

(22) Filed: Oct. 5, 2006

(65) Prior Publication Data
US 2007/0080281 A1  Apr. 12, 2007

Related U.S. Application Data

(60) Provisional application No. 60/723,942, filed on Oct. 6, 2005.

(51) Int. Cl.
*G01B 11/02* (2006.01)
(52) U.S. Cl. .................... 356/511; 356/489
(58) Field of Classification Search ............ 356/509, 356/511, 503, 504, 486, 489, 495, 515
See application file for complete search history.

(56) References Cited

U.S. PATENT DOCUMENTS

| | | | |
|---|---|---|---|
| 5,268,744 A | 12/1993 | Mori et al. | |
| 5,434,425 A | 7/1995 | Ishiyama | |
| 6,285,455 B1* | 9/2001 | Shiraishi | 356/486 |
| 6,320,658 B1 | 11/2001 | Mizutani | |
| 7,253,885 B2* | 8/2007 | Matsumoto | 355/77 |

* cited by examiner

*Primary Examiner*—Tarifur Chowdhury
*Assistant Examiner*—Michael Lapage
(74) *Attorney, Agent, or Firm*—Lawrence R. Oremland, Esq.; James W. Rose, Esq.

(57) ABSTRACT

A new and useful imaging concept is provided that is designed to improve the manner in which control information for an imaging optical system such as a lithographic imaging optical system can be generated. An imaging optical system comprises imaging optics defining a primary optical path along which a primary image is imaged, and a measurement optical path is established and includes at least part of the primary optical path. The imaging optical system is configured to obtain information from the measurement optical path for use in providing control information for the imaging optical system. Such a system is particularly useful for measuring the topography of a large region of the surface under investigation, like the entire instantaneous field of a wafer, instead of being limited to a small patch or set of patches.

36 Claims, 10 Drawing Sheets

IMAGING OPTICAL SYSTEM CONFIGURED WITH THROUGH THE LENS OPTICS FOR PRODUCING CONTROL INFORMATION

RELATED APPLICATION/CLAIM OF PRIORITY

This application is related to and claims the priority of Provisional Application No. 60/723,942, filed Oct. 6, 2005, and entitled "Through The Lens Metrology For Lithographic Lens"; which provisional application is incorporated by reference herein.

BACKGROUND

The present invention relates to an imaging optical system, and particularly to a new and useful way of producing control information for the imaging optical system. The present invention is particularly useful in providing control information for an imaging optical system such as a lithographic imaging optical system.

In a typical lithographic imaging optical system, a spatially incoherent radiation (e.g. light) source is used to illuminate a mask or reticle, to produce an image that is projected and used to image the photoresist on a semiconductor wafer. The wafer is typically supported on a machine part known as a wafer stage that can be moved (adjusted) relative to the imaging lens. A controller drives actuators associated with the wafer stage to correctly position the wafer stage in the imaging optical system.

In an imaging optical system such as a lithographic imaging optical system, it is desirable to position the wafer properly in relation to the focal plane of the imaging lens system. One way of generating control information for positioning a wafer relative to the imaging lens system is shown in U.S. Pat. No. 5,268,744. A reflection beam is directed through the optical system to a first region of a wafer and then onto a predetermined plane to determine the focal plane of the optical system, and to establish a reference position on the predetermined plane that corresponds to the focal plane. Another reflection beam is directed to another region of the wafer and onto the predetermined plane, and generating control information for positioning the other region of the wafer on the basis of the location of the other beam with respect to the reference position.

SUMMARY OF THE INVENTION

The present invention provides imaging concepts that are designed to further improve the manner in which control information for an optical system such as a lithographic imaging optical system can be generated.

The present invention provides an imaging optical system comprising imaging optics defining a primary optical path along which a primary image is projected, and a measurement optical path that is established and includes at least part of the primary optical path. The imaging optical system is configured to obtain information from the measurement optical path for use in providing control information for the imaging optical system. The present invention is particularly useful as part of a metrology system that includes, e.g. optics, detectors, electronics, mechanics etc., which detects the information from the measurement optical path, and produces control data that is useful in the imaging optical system.

According to a preferred version of the invention, the imaging optics includes an aperture stop, and the measurement optical path is in a predetermined relationship to the aperture stop of the imaging optics. The measurement optical path preferably includes a reflection optic located in a predetermined relationship to the aperture stop of the imaging optics, and the measurement optical path provides an image of a measurement image source (real or virtual) that is inserted into the imaging optics in the optical space between the aperture stop and the image plane of the imaging optical system. The measurement optical path can also provide an image of the measurement image source that is inserted between the aperture stop and the object (reticle) plane of the imaging optical system, where it can be used to investigate the reticle.

Moreover, in a preferred imaging optical system, the image plane defines a stop for the measurement optical path, and the imaging optical system further includes a measurement pupil plane that is conjugate to the measurement image stop. The measurement optical path includes an image of a measurement image source that is projected from the measurement image stop to the measurement pupil plane.

The present invention is particularly useful in providing a means of making in-situ measurements of various aspects of the imaging of a lithographic imaging lens. For example, the present invention allows for measuring the topography of a large region of the surface under investigation, like the entire instantaneous field of a wafer, instead being limited to a small patch or set of patches.

Other features of the present invention will become further apparent from the following detailed description and the accompanying drawings.

DETAILED DESCRIPTION

As discussed above, the present invention relates to a new and useful imaging concept designed to improve the manner in which control information for an imaging optical system (e.g. a lithographic imaging optical system) can be generated. The manner in which the principles of the present invention can be implemented in imaging optical systems of the type that are useful in a lithographic imaging optical system are described herein, and from that description, the manner in which the principles of the present invention can be implemented in various types of imaging optical systems will be apparent to those in the art.

Figure 1:
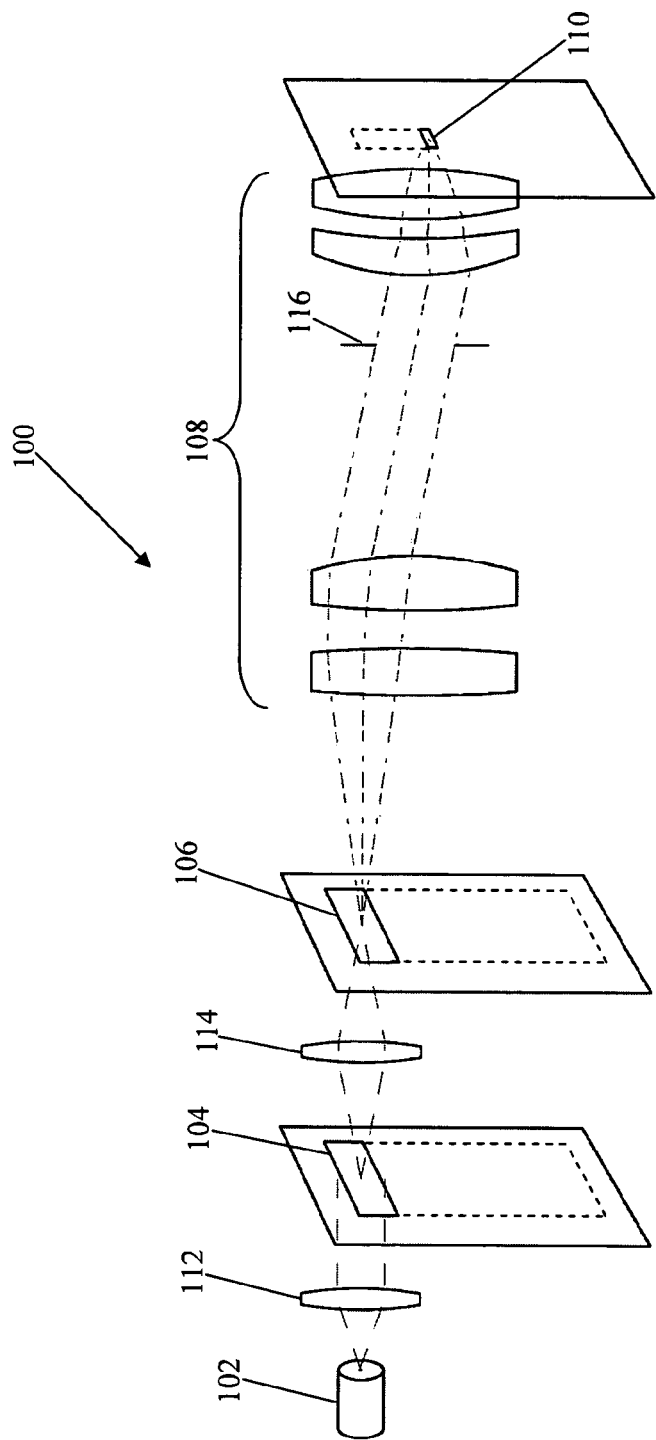
FIG. 1 is a schematic illustration of a lithographic imaging optical system with which the principles of the present invention can be used.

FIG. 1 schematically illustrates an imaging optical system 100 of the type that would be useful in a lithographic imaging optical system. The imaging optical system 100 comprises a radiation (e.g. light) source 102, a scanning slit 104 that is used to direct a scanning beam through an object (or reticle) 106, and primary imaging optics 108 that image the scanned object onto an image plane 110. Such aspects of a lithographic imaging optical system are well known and should not require further description to those in the art. The system 100 also includes illumination optics 112, 114 and an aperture stop 116 that would be well known to those in the art, and should not require further explanation.

Figure 2:
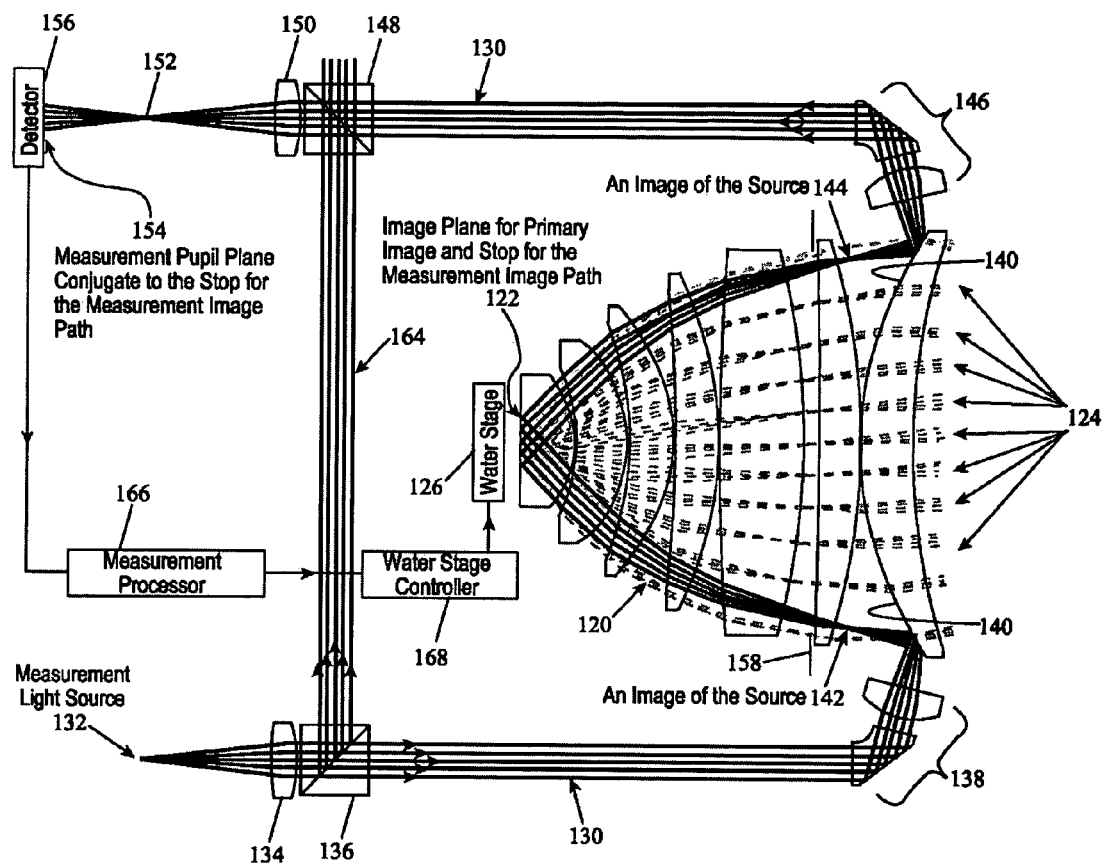
FIG. 2 shows an imaging optical system that is configured according to the principles of the present invention.

FIG. 2 schematically illustrates how the principles of the present invention can be applied to an imaging optical system of the type shown in FIG. 1. The primary imaging optics includes a lens system 120 which defines a primary optical path by which radiation (light) that originates at the object or reticle 106 is directed through the imaging optics to form an image of the reticle on a wafer image plane 122. In FIG. 2, the primary optical path is shown by image rays 124. The wafer image plane 122 is a layer of photoresist on a semiconductor wafer that is supported by a wafer stage 126. The wafer stage 126 can be controlled, in a manner described herein, to adjust the position of the wafer and its image plane 122 relative to the lens system 120.

According to the principles of the present invention, a measurement optical path is established and includes at least part of the primary optical path. The imaging optical system is configured to obtain information from the measurement optical path for use in providing control information for the imaging optical system.

In FIG. 2, the measurement optical path is schematically illustrated by image rays 130. Thus, in FIG. 2, the measurement optical path is that path taken by radiation (e.g. light) which passes from a measurement source 132, through part of the imaging optics, reflects off of the wafer image plane 122, passes back through the part of imaging optics and finally ends up on a detector 156. Thus, an image of the measurement source 132 (i.e. a real or virtual image) that is projected by the measurement optical path is transmitted at least partially through the imaging optics 120.

More specifically, the measurement optical path, as depicted in FIG. 2, begins with the measurement source 132, which is collimated by a first element 134. From there the measurement optical path passes through a beam splitter 136, through some additional optics 138, reflects off of one of the surfaces of the imaging lens (i.e. surface 140), passes through an image of the source 142 and continues through part of the primary optical path through lens assembly 120 to the primary wafer image plane 122. The reflection off of the wafer at the primary wafer image plane 122 reflects the radiation and the measurement optical path then extends back through the imaging optics 108 (122), through another image of the source 144, reflection from the one surface of the imaging optics (i.e. surface 140), through additional optics 146, a beam splitter 148 and a lens 150, which produces another image 152 of the measurement source in one plane and an image of the primary wafer image plane 122 in another plane (e.g. a pupil plane 154) which may be coincident to the surface of detector 156.

Moreover, while the measurement optical path in FIG. 2 includes reflection from lens surface 140, the measurement optical path through the imaging optics can be inserted by various surfaces in the imaging optics. For example, in FIG. 2, the imaging optics has an aperture stop 158, and the measurement optical path provides an image of the measurement image source that is inserted into the imaging optics in predetermined relation to the aperture stop 158 (also referred to as a clear aperature). Thus, in FIG. 2, the measurement image originates outside the imaging optics. An image of the measurement image source (real or virtual) is picked off, enters the primary optical path in predetermined relation to the aperture stop 158 and is transmitted at least partially through the imaging optics 120.

Figure 4:
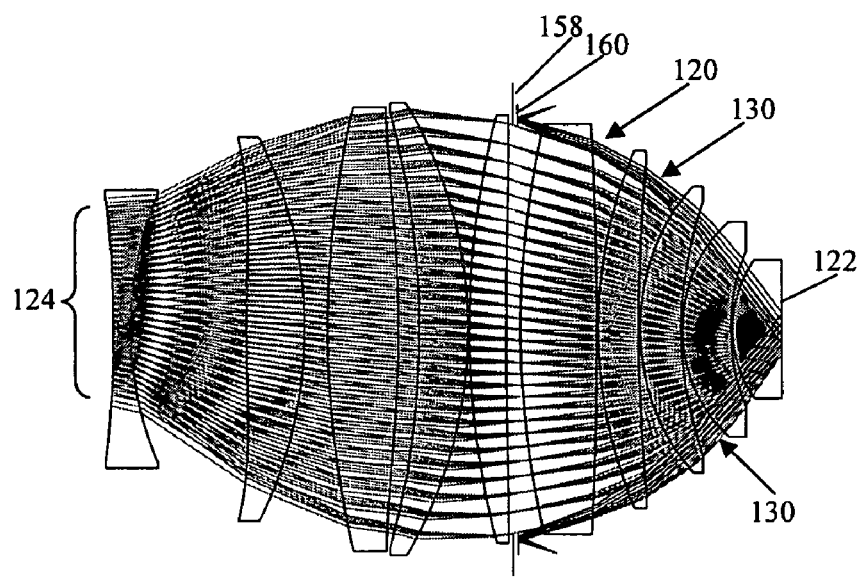
FIG. 4 is a schematic illustration of a portion of still another configuration of an imaging optical system, that is configured according to the principles of the present invention.
Figure 5:
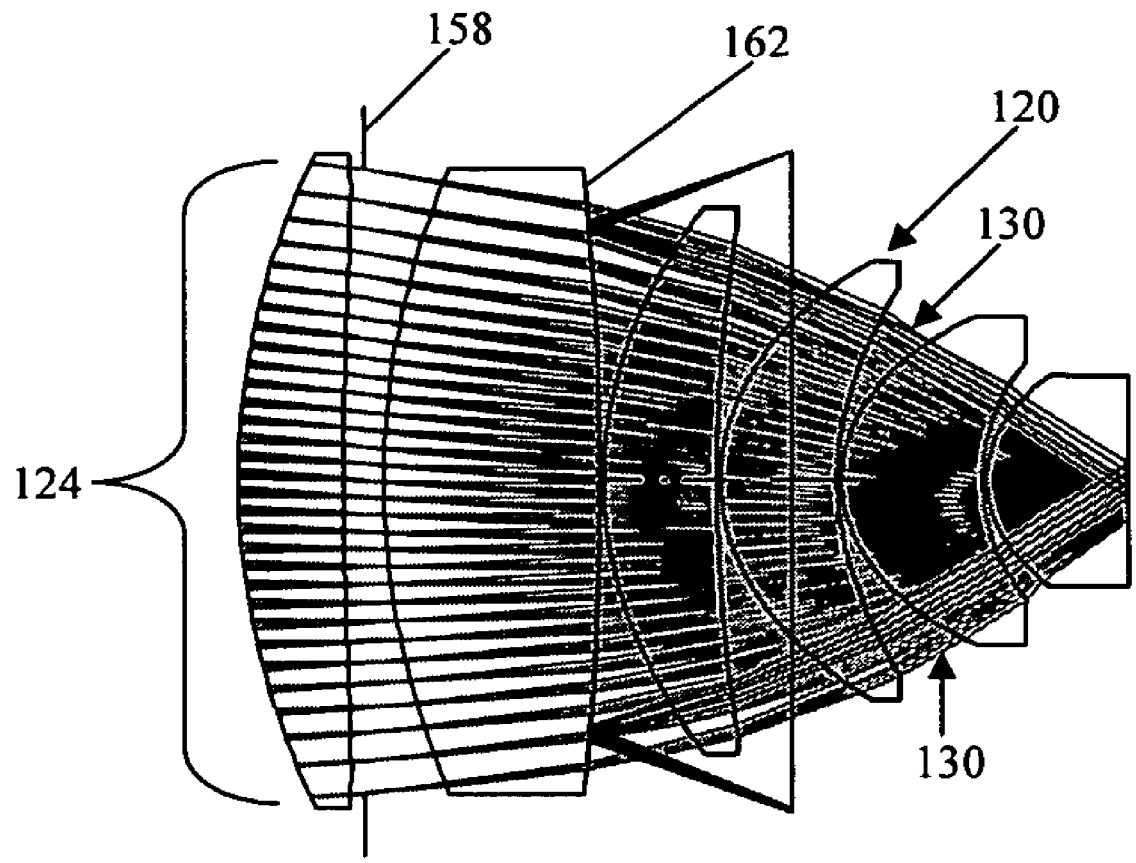
FIG. 5 is a schematic illustration of a portion of yet another configuration of an imaging optical system, that is configured according to the principles of the present invention.

It is preferred that the image of the measurement image source is inserted into the primary optical path (i.e. represented by primary image rays 124 imaged through lens system 129) in the optical space between the clear aperture 158 and the wafer image plane 122. Thus, as illustrated in FIG. 4, the measurement optical path (shown by image rays 130) provides an image of the measurement image source that is reflected into the primary optical path by a reflection optic 160 located to reflect the image of the measurement image source into the primary optical path in the optical space between the aperture stop 158 and the wafer image plane 122. Moreover, as illustrated in FIG. 5, another way to insert the image of the measurement image source into the primary optical path is by reflection directly from a lens element 162 that is located in the optical space between the aperture stop 158 and the wafer image plane 122. A lens element such as 162 that is designed to reflect the image of the measurement image source into the primary optical path may have a special coating for that purpose. Moreover, it is contemplated that various surfaces of the lens system may have coatings to provide desired reflectance or transmittance for the image of the measurement image source.

Figure 3:
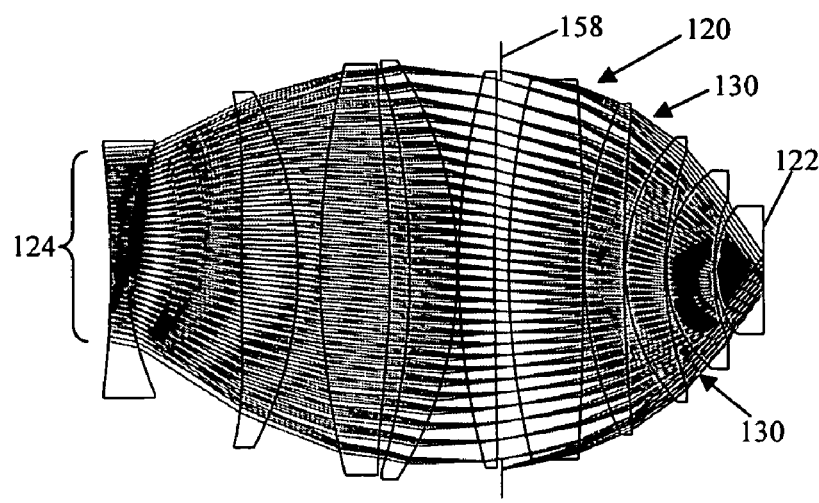
FIG. 3 is a schematic illustration of a portion of another configuration of an imaging optical system, that is configured according to the principles of the present invention.

Still further, as illustrated in FIG. 3, the image of the measurement image source (image rays 130) can be provided at the actinic wavelength, and can be inserted into the primary optical path (e.g. by reflection) at a predetermined location relative to the aperture stop 158.

The image of the measurement image source that is inserted into the primary optical path, and then projected by the measurement optical path to the detector 156, provides information that is useful in controlling the relationship of the wafer to the imaging optics. Thus, in the system of FIG. 2, the image of the measurement image source that originates outside the imaging optics is passed through the beam splitter 136, so that the image is directed into and transmitted by the measurement optical path through the imaging optics (as shown by image rays 130). Another image of the measurement image source is directed along a path 164 that is outside the imaging optics. The image of the measurement image source that is inserted into and imaged by the imaging optics is overlaid with the image that is directed along path 164 outside the imaging optics, via the beam splitter 148. The overlaid images are then imaged on the detector 156, which can be, e.g. an array of charged couple devices (CCDs) that detect the overlaid images.

The detector 156 is in circuit communication with a measurement processor 166 that processes the overlaid images, to determine if an adjustment of the position of the wafer relative to the imaging optics should be made. If an adjustment of the wafer position is desirable, the processor 166 provides appropriate control data to a wafer stage controller 168 to drive the wafer stage 126, thereby to provide the desired positioning of the wafer relative to the lens system.

Figure 8:
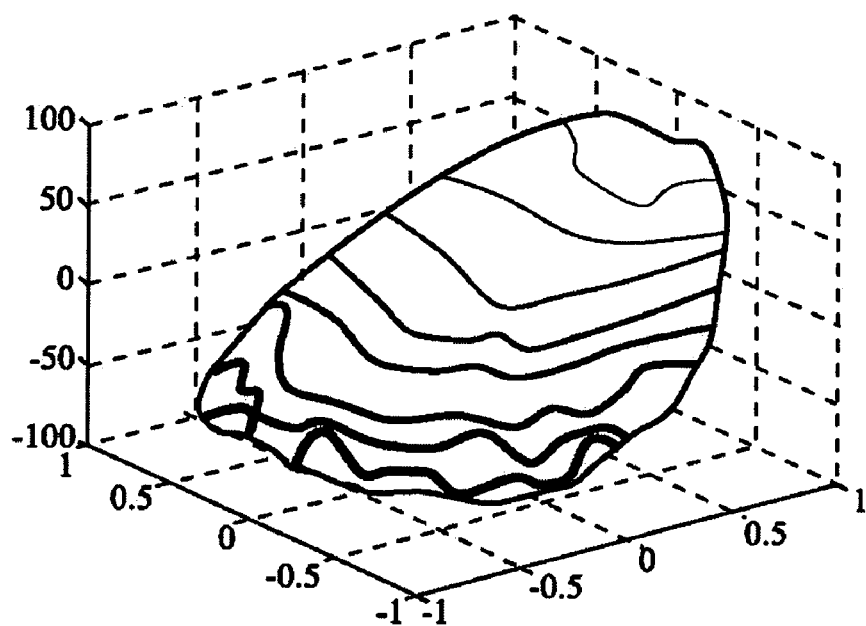
FIG. 8 is an example of a surface topography map of the type that can be produced according to the principles of the present invention.
Figure 9:
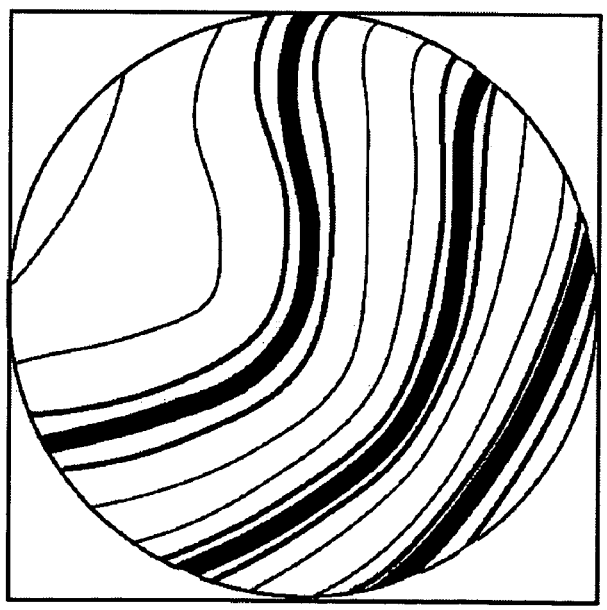
FIG. 9 is an example of a fringe pattern that would be associated with the surface topography map of FIG. 8.
Figure 10:
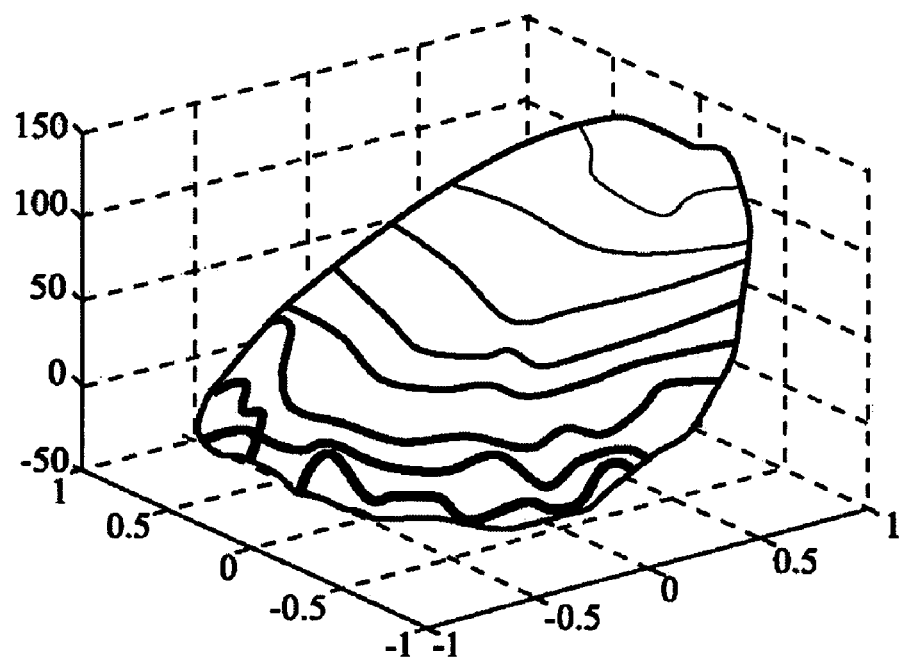
FIG. 10 is an example of a surface topography map showing the surface shifted 50 nm from FIG. 8.
Figure 11:
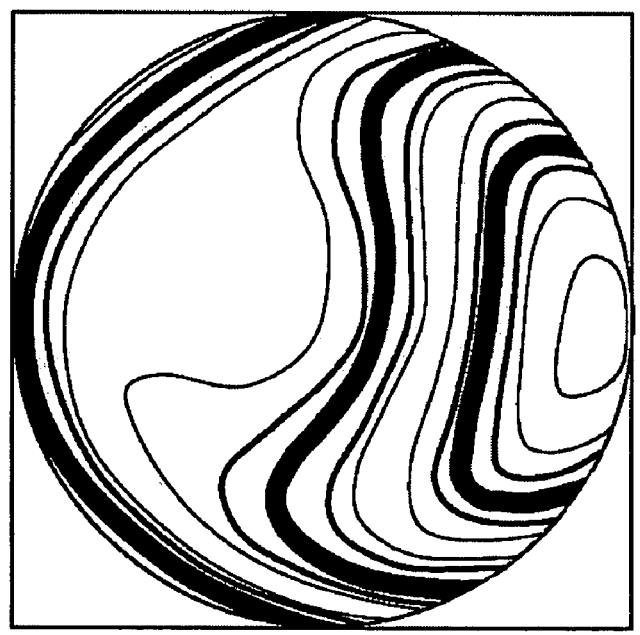
FIG. 11 is an example of a fringe pattern that would be associated with the surface topography map of FIG. 10.

As schematically illustrated in FIGS. 8-11, the overlaid images generate a fringe pattern that is sensed at the detector, and used to generate a surface topography map that is used in controlling the wafer stage. Thus, FIG. 8 is a simulation of a surface topography map plotted as a function of position (with horizontal axes in normalized coordinates and the vertical axis interpreted as nanometers of distance or optical path, etc), and FIG. 9 is a simulation of a fringe pattern related to the surface topography map of FIG. 8. In the simulation of FIGS. 8 and 9, FIG. 8 was initially generated, and the fringe pattern of FIG. 9 generated from the surface topography map of FIG. 8, but in an actual system, the detector 156 would receive the fringe pattern, and the measurement processor 166 would generate the surface topography map. Similarly, the simulation of FIGS. 10, 11 shows how the surface topography map and the fringe pattern shift as the surface under investigation shifts up or down, and the phase of the fringes also shifts. In the simulation of FIGS. 10, 11, the surface topography map (FIG. 10) has been shifted up by 50 nm (which could be the result of an upward shift of the surface under investigation). Note that the fringes associated with the surface have shifted (FIG. 11) and the surface topography map has also shifted (FIG. 10).

A measurement optical path that is inserted into the imaging optics of a primary imaging optical system and used to provide wafer control information is particularly useful with imaging optics that has telecentricity, because with such imaging optics detection from the measurement optical path can be direct, and is simple to process and to use in a metrology system.

Figure 6:
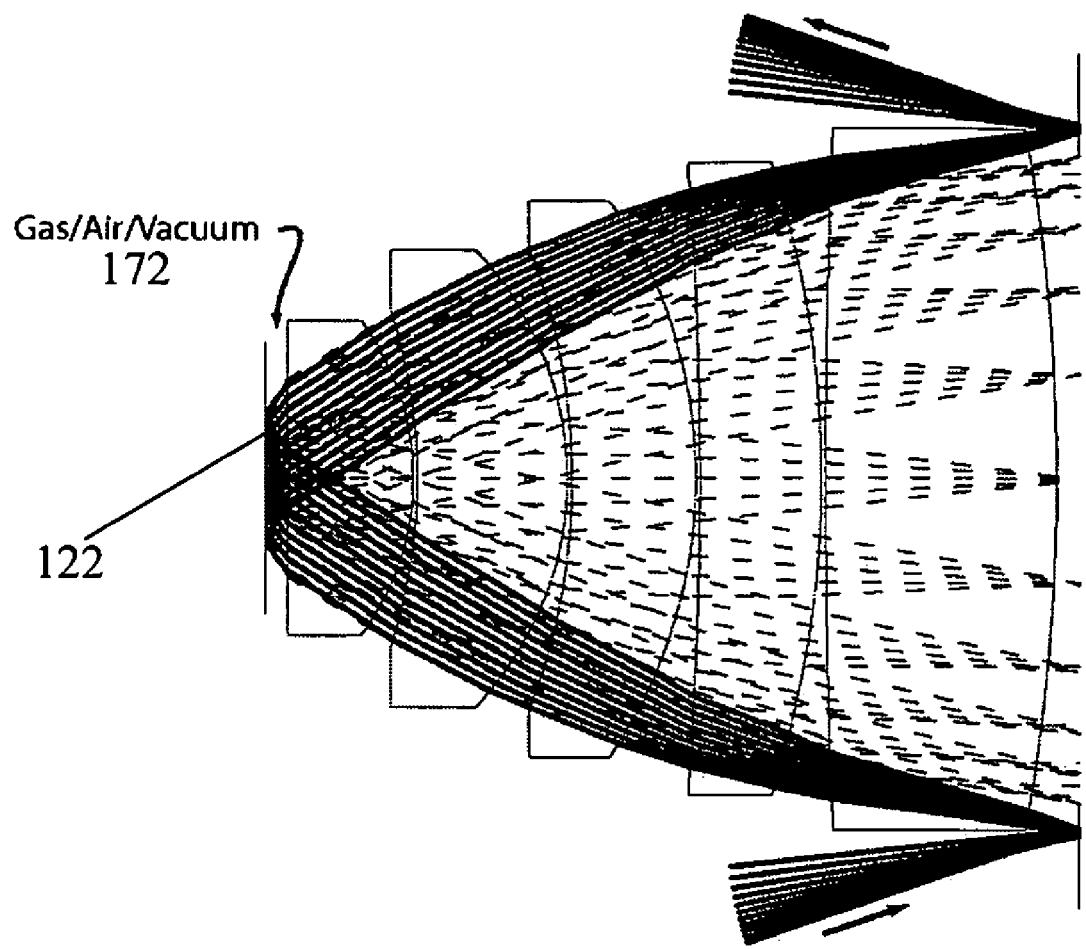
FIG. 6 is a schematic illustration of a portion of imaging optics for a "dry" lithographic imaging optical system that is configured according to the principles of the present invention.
Figure 7:
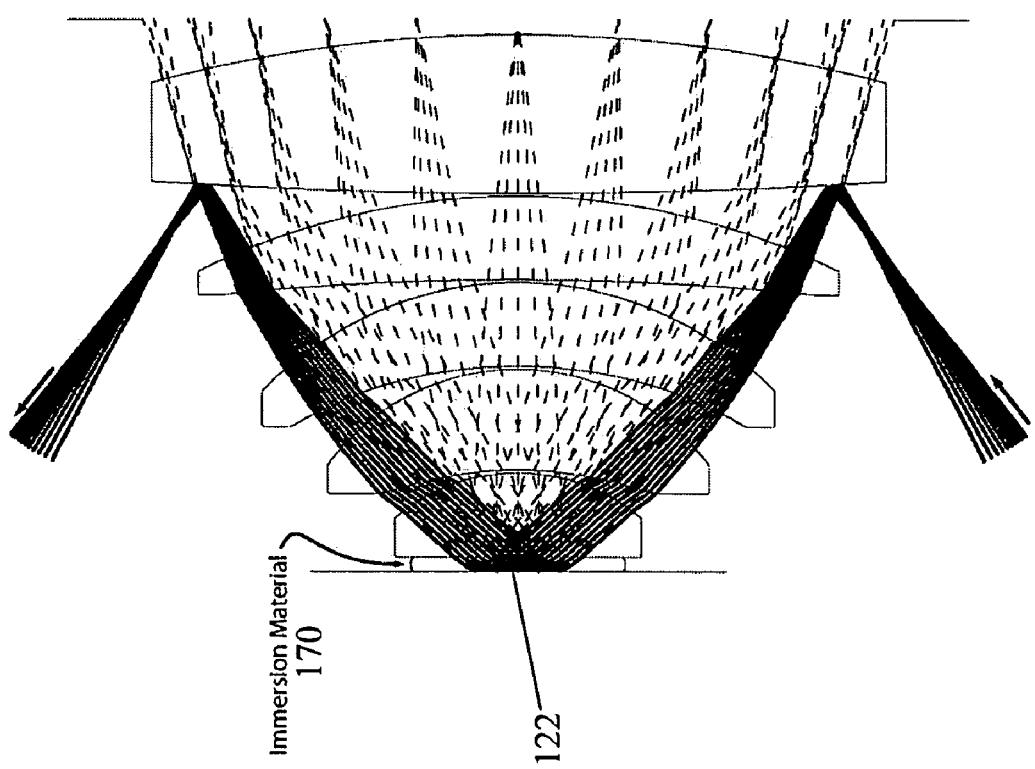
FIG. 7 is a schematic illustration of a portion of imaging optics for a "wet" lithographic imaging optical system that is configured according to the principles of the present invention.

A measurement optical path that is configured in the manner described herein is useful with a number of imaging optical systems. For example, it can be used with "wet" imaging optical system, in which the imaging onto the image plane 122 is through an immersion fluid layer (170 FIG. 7), and also with a "dry" imaging optical system, in which imaging onto the image plane 122 is through a medium 172 such as a gas, air or a vacuum (FIG. 6). Moreover, an imaging optical system according to the present invention is particularly useful for measuring the topography of a large region of the wafer surface under investigation, like the entire instantaneous field of the wafer, instead being limited to a small patch or set of patches of the wafer. Additionally, such a system allows for investigation of multiple interfaces in a lithographic system, i.e. glass-liquid interfaces, resist-liquid interface or glass-air interfaces. Also, it allows for investigation of optical interfaces during exposure, for investigation of artifacts on surfaces, impurities, inclusions, particles etcetera in the bulk material of the glass, air and/or immersion liquid, particulate impurities in the immersion liquid with, for example, a dark field or bright field test.

Figure 12:
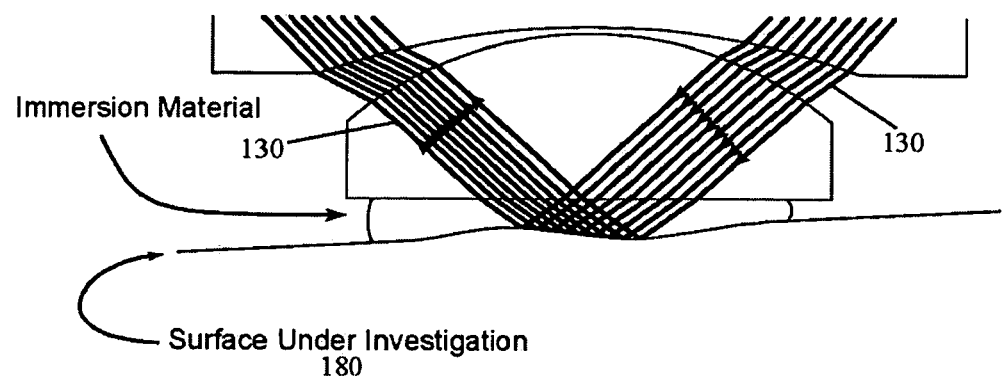
FIG. 12 is a schematic illustration of how variations in surface height (also referred to as "undulations of the surface under investigation") can affect the measurement beam, in an imaging optical system according to the present invention.
Figure 13:
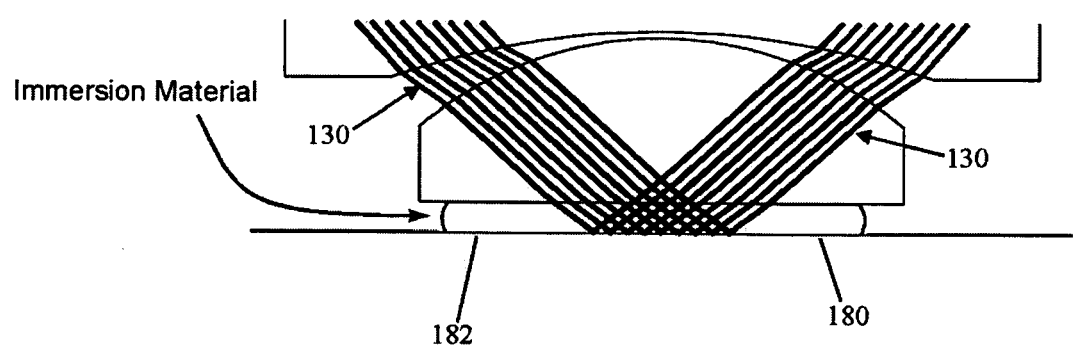
FIG. 13 is a schematic illustration of how variations in the index of refraction of a surface under investigation can affect the measurement beam, in an imaging optical system according to the present invention.
Figure 14:
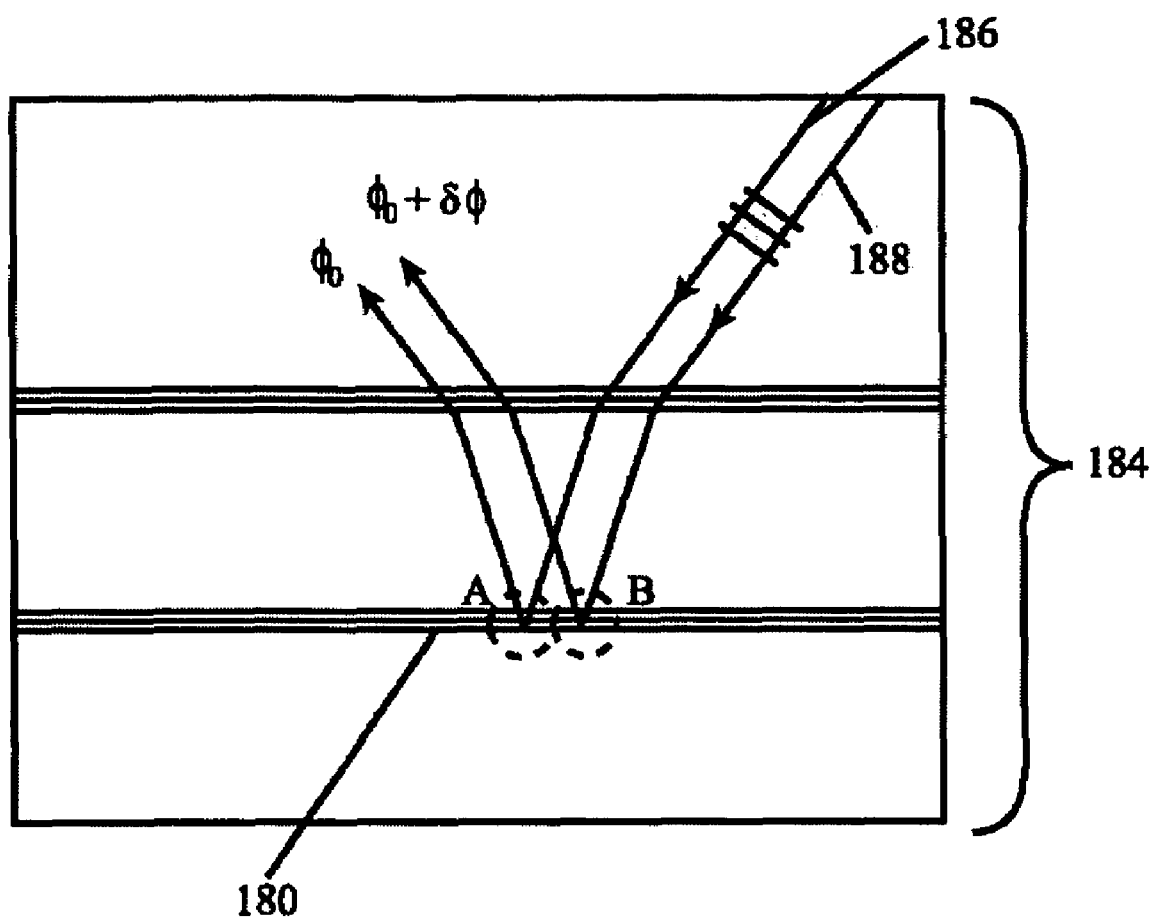
FIG. 14 is a schematic illustration of how undulations in phase due to reflection at the surface under investigation can affect the measurement beam, in an imaging optical system according to the present invention.

FIGS. 12-14 schematically illustrate different aspects of the surface under investigation that can be investigated, using the principles of the present invention. For example, as illustrated by FIG. 12 variations in surface height (also referred to as "undulations") of the surface under investigation 180 can be investigated by a measurement beam (represented by rays 130). As illustrated in FIG. 12, undulations of the surface 180 under investigation can perturb the measurement beam. In depressions of the surface under investigation, rays 130 will travel greater distances and have greater optical path, while the opposite is true for rays 130 that arrive at bumps on the surface. The global tilt and z-position of the surface produce the same effect-changing the optical path of the rays 130 and moving the surface in relation to the conjugate position of the detector. In addition, as illustrated in FIG. 13, variations in the index of refraction of the measurement beam may also be detected. In FIG. 13, the gray-scale pattern of an immersion material 182 adjacent the surface under investigation 180 represents different indices of refraction within the immersion material 182. This variation in index of refraction could arise, for example, from heating of the immersion material by the actinic radiation during exposure of the resist on the surface under investigation 180. If the lighter shading is interpreted as higher index of refraction, then the rays which travel through the center of the field of view of the immersion material will have greater optical path than those which travel through the periphery of the field of view of the immersion material. Still further, as illustrated in FIG. 14, rays incident in regions A and B of a multi layer coating 184 on a surface under investigation 180 can in general have different phases due to the structure of the multilayer coating on the surface under investigation. In FIG. 14, two rays 186, 188, associated with a planar wavefront as shown in the upper layer, enter the surface structure from above. These two rays strike the surface under investigation in regions A and B. Because of local variations of the multilayer coatings on the substrate, these two rays can have different phases as represented by $\phi_o$ and $\phi_o+\delta\phi$ respectively. Variations in the coatings can take the form of impurities of the coating materials, variations in thickness and index of refraction of the coating materials or other variations resulting for accidental or intention variations of the coating structure. Variations of the substrate material could, for example arise from structures printed in the previously printed lithographic layers.

Moreover, it should be noted that in an imaging optical system according to the present invention, when insertion and pick-off of the image projected by the measurement optical path are nearly conjugate (e.g. FIG. 2) obstruction of the primary optical path is or can be minimized or entirely eliminated. Further, fringes generated resulting from reflections from various surfaces could be isolated interferometrically using a broad band source. Also, it can be advantageous to compensate for aberrations in such a way that the wavefront is well corrected at the surface under investigation (either the wafer or the reticle), and this can be achieved with wavefront compensation in the measurement optical path prior to, or succeeding its overlap with the primary optical path. Still further, the wavelength, and bandwidth, of the measurement image are limited only by the transmission of the optics of the system since chromatic aberrations (as well as any others) can be corrected outside the primary optical path in the same way.

Also, it should be noted that the optics which allow the measurement optical path to overlap the primary optical path can be inside or outside the optical space between the aperture stop and the image plane, it is believed that placing them inside that optical space (e.g. with the use of small mirror inserted into the primary imaging path) may be at the expense of obscuration. Moreover, it will be appreciated by those in the art that the measurement image can be projected at either actinic or visible or infrared wavelengths. Also, it will be appreciated that the images of the measurement source may or may not be symmetric conjugates with respect to the surface of reflection (e.g. wafer plane or reticle plane). Additionally, the measurement optical path may or may not enter and leave the primary imaging optical path in conjugate optical spaces; that is the measurement optical path need not enter and exit the primary imaging optical path in the same air or lens space. The measurement optical path can begin or end the overlap with the primary imaging optical path in air, through the side of a lens or by reflection from a lens surface. Still further, the measurement optical path could be conditioned in several ways, including polarization, wavelength, bandwidth, pulse characteristics, phase, position and direction etcetera. In addition, the measurement optical path may or may not contain optics which compensate for aberrations generated by the imaging optics. This compensation could be achieved with reflective, refractive or diffractive nulling optics, and these optics could be placed before or after overlap with the imaging optical path.

Additionally, while disclosed in connection with one form of metrology system (e.g. for a lithographic imaging optical system), the principles of the present invention can be used with various types of lithographic imaging optical systems. For example, in FIG. 1, the lithographic imaging optical system shown in full lines is a scanning lithographic imaging optical system, in which the scanning slit 104 and the reticle 106 have openings (shown in full lines) that move in synchronism to produce the image at the image plane 110. The lithographic imaging optical system could also be of the "step and repeat type", which is well known to those in the art, and in which the scanning slit 104, the reticle 106 have larger openings that are shown in dashed lines, and are moved in a stepped fashion to produce the image shown in dashed lines in the image plane 110. In addition, an imaging optical system according to the principles of the present invention provides a measurement image that can produce input to any number of metrology systems including but not limited to a Shack-Hartmann wavefront sensor, a confocal microscope, interferometric confocal microscope, a distance measuring interferometer, a phase measuring interferometer, bi-homodyne interferometer, heterodyne interferometer, star test, knife-edge test, wire test, Hartmann test, shearing interferometer, curvature sensor, etc. Still further, an imaging optical system according to the present invention can be configured with a measurement beam that examines a surface under investigation other than a wafer located at an image plane. For example, in a lithographic imaging optical system of the type shown in FIG. 1, the principles of the present invention can be used to examine the reticle 106 as a surface under investigation.

Also, this invention can be utilized in an immersion type exposure apparatus that takes suitable measures (e.g. pressure and/or height) for a liquid (e.g. a liquid reservoir of an immersion lithography apparatus). For example, PCT patent application WO 99/49504 discloses an exposure apparatus in which a liquid is supplied to the space between a substrate (wafer) and an imaging lens system in an exposure process. The pressure and/or height of liquid in a liquid reservoir of an immersion lithography apparatus is obtained by a measurement device. The pressure and/or height can be used to determine the height and/or tilt of the substrate. U.S. Pat. No. 7,038,760 corresponds to WO 99/49504. As far as permitted, the disclosures of WO 99/49504 and U.S. Pat. No. 7,038,760 are incorporated herein by reference.

Further, the principles of the present invention can be applied to a general optical system such as an imaging optical system for a microscope or inspection system. Lastly, it should be noted that although the invention as described and illustrated in FIG. 2 includes symmetrical optical systems at the insertion side and the exit side of the primary imaging optics, this does not necessarily have to be the case. In various embodiments of the invention, the optics on the insertion side and the exit side need not be identical, but rather, can be non-symmetrical and independently implemented as desired.

With the foregoing disclosure in mind, it is believed that various ways that a measurement image can be inserted into an optical pathway, and imaged to a measurement image detector, to produce control information for use with a primary imaging optical system, according to the principles of the present invention, will be apparent to those in the art.

The invention claimed is:

1. An apparatus comprising
(a) an imaging system including a primary optical path for imaging an image onto an object and an optical element arranged in the primary optical path, the imaging system defining an object plane and an image plane;
(b) a stage configured to support a surface under investigation in the primary optical path,
(c) a measurement optical path, the measurement optical path including:
   (i) an input path for directing radiation from a measurement radiation source onto the surface under investigation supported by the stage, the input path extending at least partially through the primary optical path, including the optical element arranged in the input path,
   (ii) an output path for receiving reflected radiation from the surface under investigation, the output path including the optical element arranged in the output path
   (iii) wherein the primary optical path includes an insertion location wherein the input path enters the primary optical path and is directed at least partially through the optical element arranged in the primary optical path; and
(d) a control system including a detector, the detector optically coupled to the output path, and configured to receive the reflected radiation from the surface under investigation, the reflected radiation including topographic information related to the topography of the surface under investigation, wherein a processor is programmed to calculate a surface topography map, and the control system further configured to produce output for controlling the position of the stage using the surface topography map, so that the surface under investigation is in a predetermined relationship to the image plane and the object plane of the imaging system.

2. The apparatus of claim 1, wherein the topographic information comprises an interferogram derived by super-imposing the reflected radiation over a reference radiation signal.

3. The apparatus of claim 1, wherein the reference radiation signal is derived from the measurement radiation source.

4. The apparatus of claim 1, wherein the topographic information includes variations in the index of refraction of materials provided on the surface under investigation.

5. The apparatus of claim 1, wherein the topographic information indicates the thickness of various layers provided on the surface under investigation.

6. The apparatus of claim 1, wherein the topographic information includes undulations of the surface under investigation.

7. The apparatus of claim 1, wherein the topographic information includes undulations of the phase of the measurement beam introduced by reflection from the surface under investigation.

8. The apparatus of claim 1, further comprising collimating optics to collimate the radiation from the measurement radiation source.

9. The apparatus of claim 1, wherein a real or virtual image of the measurement radiation source is formed between the insertion location and the surface under investigation.

10. The apparatus of claim 1, wherein a plurality of optics define the primary optical path, and a real or virtual image of the measurement radiation source is formed outside the plurality of optics that define the primary optical path.

11. The apparatus of claim 1, wherein a plurality of optics define the primary optical path, and a real or virtual image of the measurement radiation source is formed inside the plurality of optics that define the primary optical path.

12. The apparatus of claim 1, wherein a plurality of optics define the primary optical path, and the real or virtual image of the measurement radiation source is formed near the insertion location of the plurality of optics that define the primary optical path.

13. The apparatus of claim 1, wherein a plurality of optics define the primary optical path, and the primary optical path defines an exit location where the output path of the measurement optical path exits the plurality of optics that define the primary optical path.

14. The apparatus of claim 13, wherein a real or virtual image of the measurement radiation source is formed between the surface under investigation and the exit location.

15. The apparatus of claim 13, wherein a real or virtual image of the measurement radiation source is formed outside the plurality of optics that define the primary optical path.

16. The apparatus of claim 13, wherein a real or virtual image of the measurement radiation source is formed inside the plurality of optics that define the primary optical path.

17. The apparatus of claim 13, wherein the real or virtual image of the measurement radiation source is formed substantially near the exit location of the plurality of optics that define the primary optical path.

18. The apparatus of claim 13, wherein a real or virtual image of the surface under investigation is formed at a location in the output path that is outside the plurality of optics that define the primary optical path.

19. The apparatus of claim 1, wherein the control system further comprises:
(i) a detector that receives reflected radiation from the surface under investigation in the form of an irradiance distribution;
(ii) a processor configured to process the topographic information from the irradiance distribution and to produce control commands related to the topographic information; and
(iii) a stage controller in circuit communication with the processor and configured to control the position of the stage by moving the stage in response to control commands from the processor.

20. The apparatus of claim 19, wherein irradiance distribution received by the detector comprises an interferogram derived by super-imposing the reflected radiation over a reference radiation signal.

21. The apparatus of claim 20, wherein a plurality of optics define the primary optical path, and the reference radiation signal is located outside the plurality of optics that define the primary optical path.

22. The apparatus of claim 21, wherein a plurality of optics define the primary optical path, and the reference radiation signal extends at least partially through the plurality of optics that define the primary optical path.

23. The apparatus of claim 19, wherein the detector is located in a measurement pupil plane which is conjugate to a pupil of the measurement optical path.

24. The apparatus of claim 21, wherein the reference radiation signal is derived from the measurement radiation source.

25. The apparatus of claim 1, wherein the surface under investigation comprises a substrate; and the primary optical path is configured to project an image onto an exposure area of the substrate, and the topographic information is related to the topography of the exposure area of the substrate.

26. The apparatus of claim 25, wherein the primary optical path projects the image onto the exposure area of the substrate through a fluid space adjacent the exposure area of the substrate.

27. The apparatus of claim 25, wherein the exposure area of the substrate is determined by a scanning slit of a scanning lithography tool.

28. The apparatus of claim 25, wherein the exposure area of the substrate is determined by a step and repeat tool.

29. The apparatus of claim 1, wherein the imaging system is configured to provide a telecentric primary optical path.

30. The apparatus of claim 1, wherein the measurement radiation wavelength is an actinic wavelength.

31. The apparatus of claim 1, wherein the measurement radiation wavelength is a non-actinic wavelength.

32. The apparatus of claim 1, wherein the control system includes a detector located in a plane that is substantially conjugate to the surface under investigation.

33. An apparatus comprising
(a) an imaging system including a primary optical path for imaging an image onto an object and an optical element arranged in the primary optical path, the imaging system defining an object plane and an image plane;
(b) a stage configured to support a surface under investigation in the primary optical path,
(c) a measurement optical path, the measurement optical path including:
(i) an input path for directing radiation from a measurement radiation source onto the surface under investigation supported by the stage, the input path extending at least partially through the primary optical path, including the optical element arranged in the input path.
(ii) an output path for receiving reflected radiation from the surface under investigation, the output path including the optical element arranged in the output path;
(iii) wherein the primary optical path has an aperture stop, and wherein the measurement optical path is in a predetermined relationship to an image of the aperture stop of the primary optical path; and
a control system including a detector, the detector optically coupled to the output path, and configured to receive the reflected radiation from the surface under investigation, the reflected radiation including topographic information related to the topography of the surface under investigation, wherein a processor is programmed to calculate a surface topography map, and the control system further configured to produce output for controlling the position of the stage using the surface topography map, so that the surface under investigation is in a predetermined relationship to the image plane and the object plane of the imaging system.

34. The apparatus of claim 33, wherein the measurement optical path includes a reflection optic located in a predetermined relationship to the image of the aperture stop.

35. The apparatus of claim 33, wherein the measurement optical path is inserted into the primary optical path in an optical space between the aperture stop and the surface under investigation.

36. The apparatus of claim 33, wherein the imaging system includes imaging optics that provides the primary optical path, and wherein the measurement optical path is inserted into the primary optical path by reflection from an element of the imaging optics.

* * * * *

UNITED STATES PATENT AND TRADEMARK OFFICE
CERTIFICATE OF CORRECTION

PATENT NO. : 7,612,892 B2 Page 1 of 1
APPLICATION NO. : 11/544833
DATED : November 3, 2009
INVENTOR(S) : Daniel G. Smith, David M. Williamson and W. Thomas Novak It is certified that error appears in the above-identified patent and that said Letters Patent is hereby corrected as shown below:

Column 8, line 35 Add a "," after the word "path" to read as "path,"

Column 10, line 47 replace the "." after the word "path" with a "," to read as "path,"

Signed and Sealed this

Twenty-third Day of March, 2010

David J. Kappos
*Director of the United States Patent and Trademark Office*